(12) United States Patent
Goyal et al.

(10) Patent No.: US 9,667,300 B2
(45) Date of Patent: May 30, 2017

(54) FREQUENCY SYNTHESIZER FOR ACHIEVING FAST RE-LOCK BETWEEN ALTERNATE FREQUENCIES IN LOW BANDWIDTH PLLS

(71) Applicant: TEXAS INSTRUMENTS INCORPORATED, Dallas, TX (US)

(72) Inventors: Jagdish Chand Goyal, Bangalore (IN); Krishnaswamy Thiagarajan, Bangalore (IN); Jayawardan Janardhanan, Bellevue, WA (US); Srikanth Manian, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/753,940

(22) Filed: Jun. 29, 2015

(65) Prior Publication Data

US 2015/0381190 A1 Dec. 31, 2015

Related U.S. Application Data

(60) Provisional application No. 62/019,194, filed on Jun. 30, 2014.

(51) Int. Cl.
*H04B 1/40* (2015.01)
*H03L 7/107* (2006.01)
*H03L 7/197* (2006.01)

(52) U.S. Cl.
CPC ............. *H04B 1/40* (2013.01); *H03L 7/1075* (2013.01); *H03L 7/1976* (2013.01)

(58) Field of Classification Search
CPC ......... H04B 1/40; H03L 7/1075; H03L 7/093; H03L 7/1976; H04L 27/148; H04L 27/152
USPC ............................................................ 455/76
See application file for complete search history.

(56) References Cited

U.S. PATENT DOCUMENTS

| | | | |
|---|---|---|---|
| 5,343,497 A * | 8/1994 | Canosi ................. | H04B 7/2675 370/350 |
| 2009/0224805 A1* | 9/2009 | Bore ....................... | H03F 3/456 327/65 |

* cited by examiner

*Primary Examiner* — Eugene Yun
(74) *Attorney, Agent, or Firm* — Michael A. Davis, Jr.; Charles A. Brill; Frank D. Cimino

(57) ABSTRACT

A frequency synthesizer that includes a reference frequency scaler and a phase locked loop (PLL) coupled to the reference frequency scaler. The reference frequency scaler is configured to generate a first reference frequency and a second reference frequency. The PLL is configured to generate a first output frequency based on the first reference frequency during a first timeslot and a second output frequency based on the second reference frequency during a second timeslot. The PLL comprises a loop filter that includes a first switch connected in series to a first capacitor and configured to close during the first timeslot and a second switch connected in series to a second capacitor and configured to open during the first timeslot.

15 Claims, 3 Drawing Sheets

`US 9,667,300 B2`

FREQUENCY SYNTHESIZER FOR ACHIEVING FAST RE-LOCK BETWEEN ALTERNATE FREQUENCIES IN LOW BANDWIDTH PLLS

CROSS-REFERENCE TO RELATED APPLICATIONS

The present application claims priority to U.S. Provisional Patent Application No. 62/019,194, filed Jun. 30, 2014, titled "A Novel Architecture For Achieving Fast Re-Lock Between Alternate Frequencies In Low Band-Width PLLS," which is hereby incorporated herein by reference in its entirety.

BACKGROUND

Professional Mobile Radio (PMR), also known as land mobile radio (LMR) in North America and private mobile radio (PMR) in the UK, was developed for business users who need to communicate over relatively short distances with a central base station/dispatcher. PMR systems may be used in military, oil and gas, public security, rail transport, emergency, and various other applications.

PMR systems have generally been based on analog technology. To increase spectrum efficiency as well as improve communication quality, various jurisdictions plan to migrate from analog to digital PMR/LMR. DMR (Digital Mobile Radio) is a digital radio standard for Professional Mobile Radio (PMR) systems. Requirements of the DMR standard include a 12.5 kHz channel that supports two independent transmissions via radio frequency signals. Thus, under the DMR standard, utilizing Time Division Multiple Access (TDMA), the 12.5 kHz channel is divided into two alternating time slots which each act as a separate communication channel with an equivalent bandwidth of 6.25 kHz. The frequency synthesizers employed in digital radio systems often employ a phase locked loop to generate the radio frequency signals.

SUMMARY

The problems noted above are solved in large part by systems and methods for achieving re-lock between alternate frequencies in a low bandwidth PLL. In some embodiments, a frequency synthesizer includes a reference frequency scaler and a phase locked loop (PLL) coupled to the reference frequency scaler. The reference frequency scaler is configured to generate a first reference frequency and a second reference frequency. The PLL is configured to generate a first output frequency based on the first reference frequency during a first timeslot and a second output frequency based on the second reference frequency during a second timeslot. The PLL comprises a loop filter that includes a first switch connected in series to a first capacitor and configured to close during the first timeslot and a second switch connected in series to a second capacitor and configured to open during the first timeslot.

In another embodiment, a digital radio includes a radio frequency transceiver and a frequency synthesizer coupled to the radio frequency transceiver. The radio frequency transceiver is configured to transmit a first carrier frequency in a communication channel during a first timeslot and a second carrier frequency in the communication channel during a second timeslot. The frequency synthesizer is configured to generate the first and second carrier frequencies for the radio frequency transceiver. The frequency synthesizer comprises a first switch connected in series to a first capacitor and configured to close during the first timeslot. The frequency synthesizer also comprises a second switch connected in series to a second capacitor and configured to open during the first timeslot.

In a further embodiment, a method for locking two output frequencies to two reference frequencies includes receiving a first frequency by a phase lock loop (PLL) during a first timeslot. The method further includes closing a first switch, included in the PLL, connected in series with a first capacitor and connected in parallel with a second switch and a second capacitor during the first timeslot. The method also includes generating a first output frequency by the PLL based on the first reference frequency during the first timeslot. The method also includes receiving a second reference frequency by the PLL during a second timeslot. The method also includes closing the second switch during the second timeslot. The method also includes generating a second output frequency by the PLL based on the second reference frequency during the second timeslot.

BRIEF DESCRIPTION OF THE DRAWINGS

For a detailed description of various examples, reference will now be made to the accompanying drawings in which.

NOTATION AND NOMENCLATURE

Figure 1:
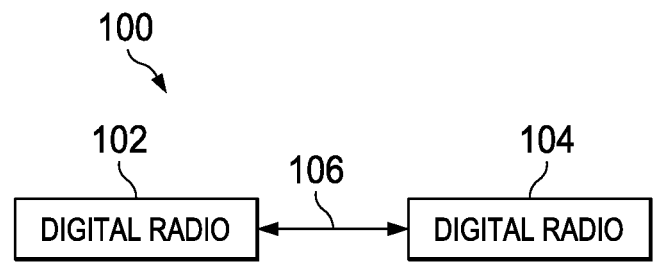
FIG. 1 shows a block diagram of a digital radio communication system in accordance with various embodiments.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . . " Also, the term "couple" or "couples" is intended to mean either an indirect or direct connection. Thus, if a first device couples to a second device, that connection may be through a direct connection, or through an indirect connection via other devices and connections. The recitation "based on" is intended to mean "based at least in part on." Therefore, if X is based on Y, X may be based on Y and any number of other factors.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Digital Mobil Radio (DMR) is a digital radio system that enables operators to perform duplex mode operations. More specifically, DMR allows mobile radios to support two simultaneous and independent communications such as voice calls, text messages, location data, etc. through a single communication channel. DMR utilizes Time Division Multiple Access (TDMA) to communicate utilizing the single communication channel. As such, the channel is divided into two alternating timeslots for the two separate communications. Therefore, one communication is communicated during one timeslot while a second communication at a second frequency utilizes the other timeslot.

In the conventional DMR system, a phase lock loop (PLL) is utilized to generate the two output signals at the two different frequencies used in the communications. Therefore, the PLL must lock to two separate reference signals. In many of these systems, the bandwidth of the PLL is very narrow (e.g., less than 10 kHz). Therefore, it is difficult to achieve a fast lock to the two separate reference signals as the timeslots alternate. Therefore, there is a need to develop a system that allows the PLL to relock between two alternating frequencies as the timeslots alternate. To achieve a faster relock, a conventional DMR system may increase the current of the charge pump of the PLL, thereby increasing the bandwidth of the PLL while the PLL acquires lock. However, this requires as much as a 20 to 30 times current increase of the charge pump during the lock phase. In some systems, this requires as much as 50 mA of current to achieve a faster lock. Generating this much current is difficult and consumes unacceptable levels of power. Embodiments of the DMR system disclosed herein include PLL frequency generation that may relock to the reference frequency in very little time while consuming very little power.

FIG. 1 shows a block diagram of a digital radio communication system 100 in accordance with various embodiments. Digital radio communication system 100 may be a Professional Mobile Radio (PMR) system, also known as land mobile radio (LMR) system in North America and private mobile radio (PMR) system in the UK. As such, digital radio communication system 100 may include digital radio 102 which is communicatively coupled to digital radio 104 by communication channel 106. Thus, digital radio 102 may transmit and receive communications with digital radio 104 through communication channel 106. In some embodiments, this communication through communication channel 106 includes duplex operations such that communication channel 106 supports two simultaneous and independent communications.

Communication channel 106 may be a single, in an embodiment, 12.5 kHz channel that supports Time Division Multiple Access (TDMA) communications. Thus, communication channel 106 may be divided into two alternating timeslots. Each timeslot acts as a separate communication channel with an equivalent bandwidth of half the bandwidth of the overall channel (e.g., 6.25 kHz) while maintaining the same profile as an analogue signal that utilizes the entire bandwidth of the channel (e.g., 12.5 kHz). This enables the two simultaneous and independent communications to be made between digital radio 102 and digital radio 104 through communication channel 106.

Figure 2:
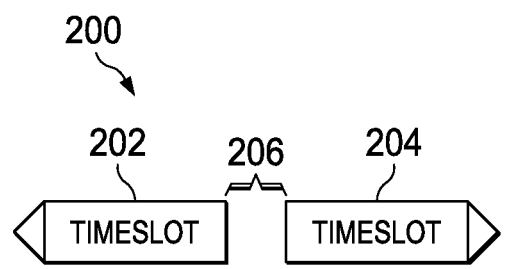
FIG. 2 shows a block diagram of two timeslots in a communication channel in accordance with various embodiments.

FIG. 2 shows a block diagram of two timeslots 200 in a communication channel 106 in accordance with various embodiments. The two timeslots 200 may include timeslots 202 and 204. Communications in timeslot 202 may be made at a different frequency than communications made during timeslot 204. While the communications may be made at different frequencies, the communications made during timeslot 202, in an embodiment, are in the same frequency band (e.g., VHF, UHF-1, 2, 3, 4, etc.) as communications made during timeslot 204. For example, communications may be made between digital radios 102 and 104 at 40 MHz in the VHF frequency band during timeslot 202 while communications between digital radios 102 and 104 may be made at 110 MHz in the VHF frequency band during timeslot 204. While the difference in frequency between communications made during timeslot 202 and timeslot 204 may be any amount, as long as the communications remain in the same frequency band, in some embodiments, the difference may be between 50 and 70 MHz.

Because the communications made during timeslot 202 may be made at a frequency different from the communications made during timeslot 204, a window 206 of time is enabled between timeslots 202 and 204 to allow digital radio 102 and/or 104 to switch from communicating at a first frequency during timeslot 202 to communicating at a second frequency during timeslot 204. In some embodiments, the window 206 may be 2.5 ms. In addition to locking to a new frequency, during window 206, a power amplifier residing in digital radio 102 and/or 104 must ramp-up/down. Therefore, digital radio 102 and/or 104 must lock in the frequency that is to be transmitted/received during timeslot 204 in around 1-1.5 ms.

As previously mentioned, timeslots 202 and 204 alternate. For example, digital radio 102 may transmit/receive communications at a first frequency during timeslot 202 followed by window 206. Then, digital radio 102 may transmit/receive communications at a second frequency during timeslot 204 followed by window 206. This may be followed by digital radio 102 transmitting/receiving communications at the first frequency again during timeslot 202 followed by window 206. This pattern may continue during the course of the communications. In this way, the two communications at different frequencies may be made utilizing the same communication channel 106.

Figure 3:
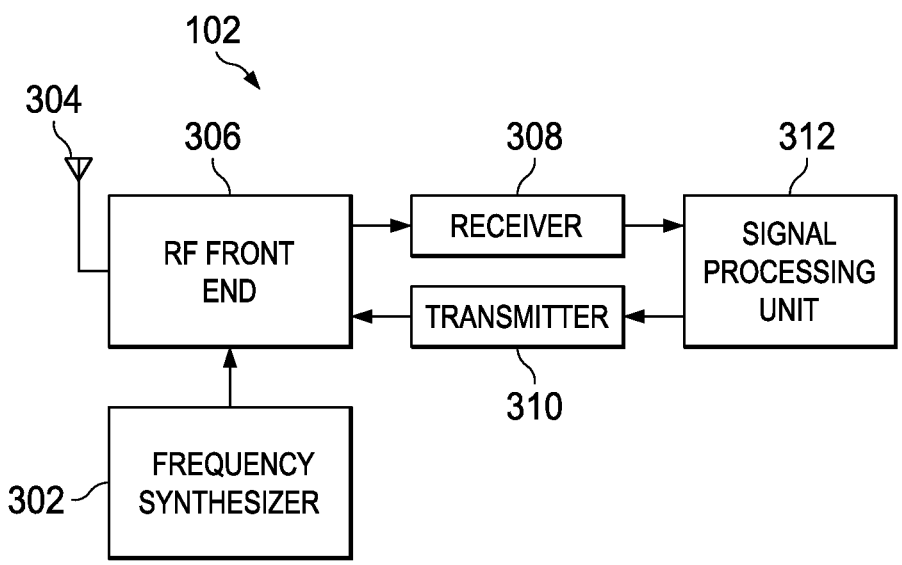
FIG. 3 shows a block diagram of a digital radio in accordance with various embodiments.

FIG. 3 shows a block diagram of digital radio 102 in accordance with various embodiments. The digital radio 102 may conform to radio communication standards promulgated by the European Telecommunications Standards Institute (ETSI), such as the digital mobile radio standard, or to any of various other standards. The digital radio 102 includes an antenna 304, a radio frequency (RF) front end 306, a receiver 308, a frequency synthesizer 302, a transmitter 310, and a signal processing unit 312. While, in the interest of clarity, the digital radio 102 is presented in FIG. 3 as having a particular architecture, other embodiments of the digital radio 102 may be arranged differently and/or include different/additional components or functional subsystems.

In some embodiments, the radio 102 operates as a half-duplex transceiver, which means that the radio 102 is configured to provide a non-simultaneously bi-directional communication. At any given time, either a receive (RX) path or a transmit (TX) path is provided. While the RX path is in use, the TX path may be deactivated and vice versa. The RX path and the TX path may use the same RF front end 306 and the antenna 304. As such, the RF front end 306 may include a duplexer configured to switch between the RX path and the TX path. A signal in the RX path starts at the antenna 304, and passes through the RF front end 306 and the receiver 308 to the signal processing unit 312. A signal in the TX path may travel through the signal processing unit 312, the transmitter 310, and the RF front end 306, and be transmitted via the antenna 304. More particularly, in the TX path, the transmitter 310 may encode digital data, provided by the signal processing unit 312, to a baseband signal. The RF front end 304 may include a modulator that modulates the baseband signal with an RF carrier signal provided by the synthesizer 302. The RF front end may also include a transmission power amplifier for amplifying the modulated signal for transmission via the antenna 304, and various other transmit path components.

The antenna 304 converts RF signals between conducted and airwave form. Upon receipt of an RF signal over the antenna 304, the RF front end 304 may apply a local oscillation frequency generated by the synthesizer 302 to down convert the RF signal to an intermediate frequency signal. The receiver 308 coupled to the RF front end 306 is configured to extract information from signals provided by the RF front end 306 and to generate signals to be further processed by the signal processing unit 312. The synthesizer 302 generates signals at frequencies needed for operation of the radio 102. For example, the synthesizer 302 may generate carrier frequencies to be used by the radio 102 and transmitted through channel 106 during timeslots 202 and/or 204. Because the carrier frequency carried during timeslot 202 may be different than the carrier frequency carried during timeslot 204, synthesizer 302 may generate two carrier frequencies to be utilized by radio 102.

Figure 4:
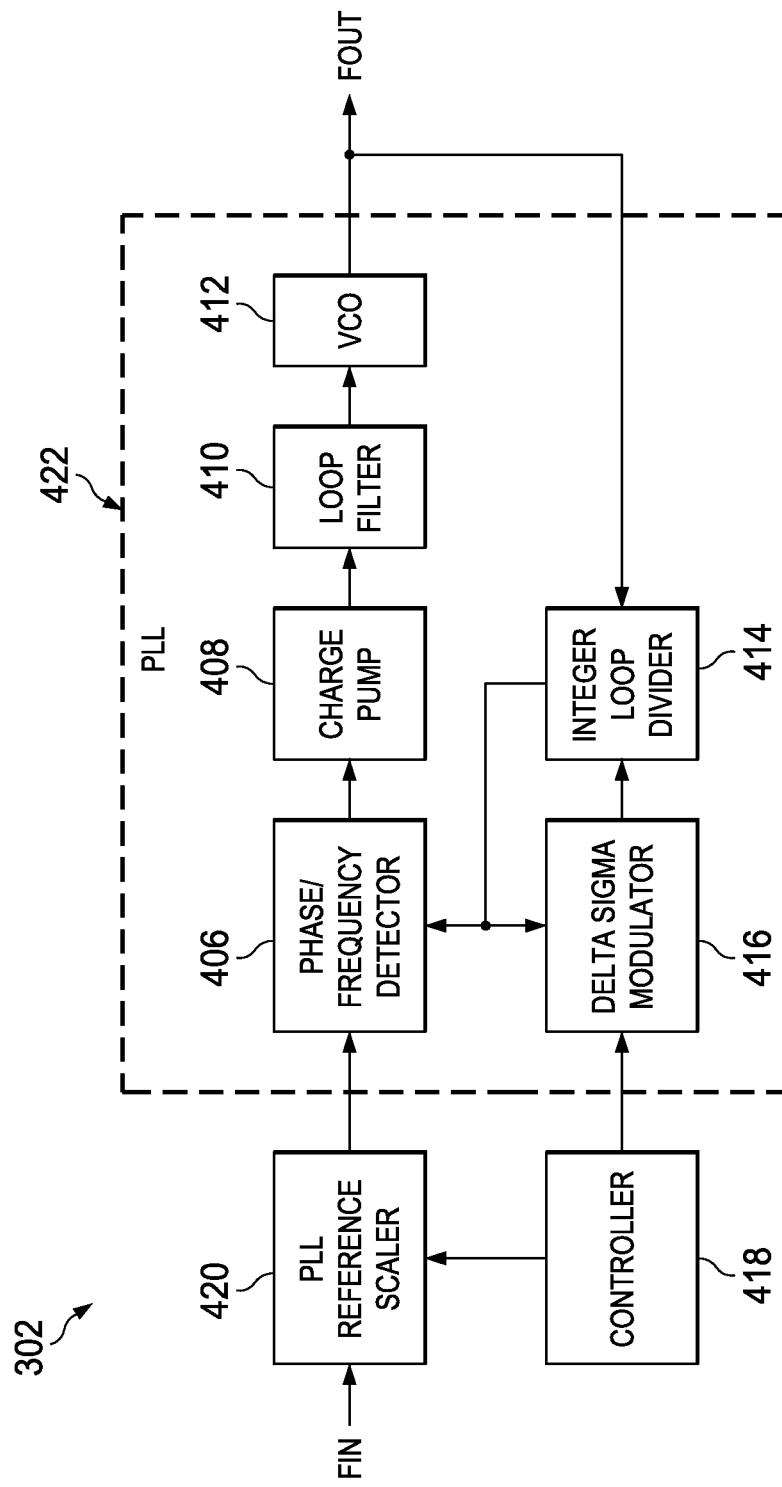
FIG. 4 shows a block diagram of an embodiment of a frequency synthesizer in accordance with various embodiments.

FIG. 4 shows a block diagram of an embodiment of the frequency synthesizer 302 in accordance with various embodiments. The synthesizer 302 includes a PLL 422 and a PLL reference frequency scaler 420. The PLL 422 generates an output signal FOUT having a frequency that is a programmable multiple of a reference frequency provided by the PLL reference frequency scaler 420. In an embodiment, the PLL 422 may generate multiple output signals FOUT (e.g., two FOUT signals) at different frequencies that are a multiple of different reference frequencies provided by the PLL reference frequency scaler 420. For example, during timeslot 202, PLL 422 may generate an output signal FOUT at a first frequency that is a multiple of a first reference frequency provided by the PLL reference frequency scaler 420, while during timeslot 204, PLL 422 may generate an output signal FOUT at a second frequency that is a multiple of a second reference frequency provided by the PLL reference frequency scaler 420.

The PLL reference scaler 420 may receive an input frequency, e.g., a crystal oscillator generated frequency FIN, and generates acts to scale (e.g., multiplies and/or divides) the FIN. In alternative embodiments, the FIN may be provided directly to PLL 422 without being scaled by PLL reference scaler 420. In some embodiments, multiple FINs may act as the input frequency for different periods of time. For example, one FIN may act as the input frequency during timeslot 202 while a second FIN may act as the input frequency during timeslot 204. In this way, PLL reference frequency scalar 420 may provide different reference frequencies during each of timeslots 202 and 204 to PLL 422.

The PLL 422 includes a VCO 412, an integer loop divider 414, a delta-sigma modulator 416, a phase/frequency detector (PFD) 406, a charge pump 408, and a loop filter 410. The VCO 412 generates the PLL output signal FOUT based on a control voltage provided by the loop filter 410. While shown internal to PLL 422 in FIG. 4, VCO 412 may, in an embodiment, be external to the remaining components of PLL 422 (e.g., VCO 412 may be on a separate chip than the other components of PLL 422). In an embodiment, because the PLL reference scaler 420 may provide a reference signal during timeslot 202 that has a different frequency than the reference frequency provided during timeslot 204, the VCO 412 may generate different PLL output signal FOUTs based on two different control voltages, one control voltage during timeslot 202 and a second control voltage during timeslot 204.

The output frequency of the VCO 412 is reduced by the integer divider 414 and compared, by the PFD 206, to the reference frequency provided by the PLL reference frequency scaler 420. The integer divider 414 may include a dual-modulus divider, binary counters, or other circuitry that allows division of the output frequency of the VCO 412 by a programmable divisor coefficient. The delta-sigma modulator 416 controls variation in the integer values applied by the integer divider 414 to produce the fractional divisor applied to the VCO output frequency. For example, if the fractional divisor to be applied to the VCO output frequency is 10.5, then the delta-sigma modulator 416 may cause the integer loop divider 414 to divide the VCO output frequency by 10 half the time and by 11 half the time to produce an average division of 10.5. The delta-sigma modulator 416 randomizes the application timing of the different integer divisor coefficients while maintaining the desired average divisor coefficient. The delta-sigma modulator 416 may be a multi-stage noise shaping (MASH) delta sigma modulator.

The PFD 406 identifies differences in the phase and/or frequency of the output of the integer divider 414 and the reference frequency or frequencies provided by the PLL reference frequency scaler 420, and generates signals that control the charge pump 408 responsive to the identified differences in phase and/or frequency. The charge pump 408 generates currents to charge and discharge one or more capacitors in the loop filter 410. The voltage across each of the capacitors may form the control voltage applied to the VCO 412 for a given period of time (e.g., the voltage across one capacitor may form the control voltage applied to the VCO 412 during timeslot 202 while the voltage across a second capacitor may form the control voltage applied to the VCO 412 during timeslot 204). For example, if the PFD 406 determines that the reference frequency provided by the PLL reference frequency scaler 420 is higher than the frequency output by the integer loop divider 414, then the PFD 406 may output signals that cause the charge pump 408 to drive a current into the loop filter 410, thereby increasing the voltage across one of the capacitors and increasing the output frequency of the VCO 412 during the designated timeslot.

The frequency synthesizer 302 may also include a controller 418 that determines and sets the frequency scaling coefficients applied by the PLL reference frequency scaler 420 and the PLL 422. The controller 418 may be implemented as a processor (e.g., a microcontroller, a general-purpose processor, etc.) that executes instructions retrieved from a storage device, or as dedicated hardware circuitry. The controller 418 may compute the coefficients for frequency synthesis based on each selected output frequency, may retrieve pre-computed coefficients from a table, etc.

Figure 5A:
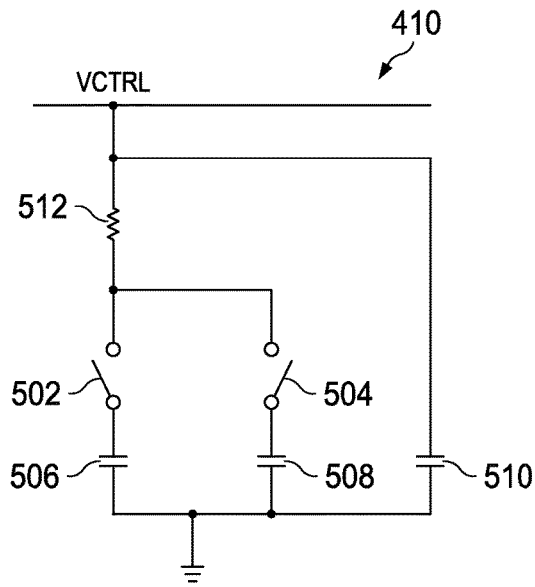
FIG. 5A shows a circuit diagram of a loop filter in accordance with various embodiments.

FIG. 5A shows a circuit diagram of loop filter 410 in accordance with various embodiments. Loop filter 410 may comprise resistor 512, switches 502 and 504, and capacitors

506, 508, and 510. Switch 502 may be any type of digital or analog switch that is connected to capacitor 506 in series. Similarly, switch 504 may be any type of digital or analog switch that is connected to capacitor 508 in series. Switch 502 and capacitor 506 are connected to switch 504 and capacitor 508 in parallel. Capacitor 510 is connected to switches 502 and 504 and capacitors 506 and 508 in parallel.

Initially, during timeslot 202, switch 502 is closed while switch 504 is open. Thus, capacitor 506 will charge based on the first reference voltage. Hence, capacitor 506 acts to control the VCO 412 and ultimately FOUT during timeslot 202 because the control voltage is the capacitance across capacitor 506 while switch 502 is closed. Similarly, once timeslot 202 ends and window 206 begins, switch 502 opens while switch 504 closes. Thus, capacitor 508 will charge based on the second reference voltage. Hence, capacitor 508 acts to control the VCO 412 and ultimately FOUT during timeslot 204 because the control voltage is the capacitance across capacitor 508 while switch 504 is closed. In other words, for each timeslot 202, switch 502 is closed while switch 504 is open. Similarly, for each timeslot 204, switch 504 is closed while switch 502 is open. This enables capacitor 506 to ultimately control FOUT (i.e., the carrier frequency) due to capacitor 506's control of the control voltage during timeslot 202 while capacitor 508 ultimately controls FOUT (i.e., the carrier frequency) due to capacitor 508's control of the control voltage during timeslot 204. Because the filter characteristics of loop filter 410, except for the control voltage, should be the same during each of timeslots 202 and 204, the capacitance of capacitors 506 and 508, in some embodiments, are equal.

After the initial timeslots 202 and 204, capacitors 506 and 508 are fully charged except for some minor discharge while their respective switches are open (e.g., while switch 502 is open, the discharge of capacitor 506 and while switch 504 is open, the discharge of capacitor 508). In some embodiments, because the capacitance of capacitor 510 is 15 to 35 times less than the capacitance of capacitors 506 and 508, the discharge of each of capacitors 506 and 508 while their respective switches are open is approximately 3-5% of the total charge carried by the capacitors 506 and 508. Therefore, in all subsequent timeslots 202 and 204, once switch 502 closes for timeslot 202 and switch 504 closes for timeslot 204, the time to bring the control voltage to the required voltage to generate the carrier frequency is reduced substantially. In some embodiments, the time to bring the control voltage to the required voltage to generate the carrier frequency is less than 1.5 ms. In this way, loop filter 410 acts to allow for fast re-lock between alternating output frequencies of PLL 422.

Figure 5B:
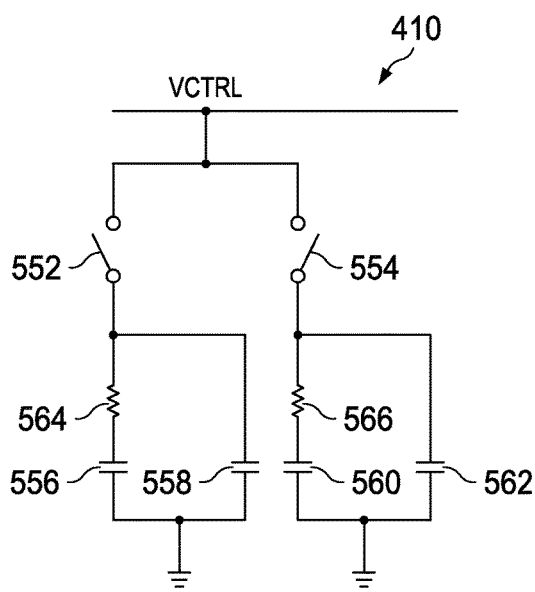
FIG. 5B shows a circuit diagram of a loop filter in accordance with various embodiments.

FIG. 5B shows a circuit diagram of loop filter 410 in accordance with various embodiments. Loop filter 410 may comprise resistors 564 and 566, switches 552 and 554, and capacitors 556, 558, 560, and 562. Switch 552 may be any type of digital or analog switch that is connected to capacitors 556 and 558 in series. Similarly, switch 554 may be any type of digital or analog switch that is connected to capacitors 560 and 562 in series. Capacitor 556 is connected to capacitor 558 in parallel. Capacitor 560 is connected to capacitor 562 in parallel.

Initially, during timeslot 202, switch 552 is closed while switch 554 is open. Thus, capacitor 556 will charge based on the first reference voltage. Hence, capacitor 556 acts to control the VCO 412 and ultimately FOUT during timeslot 202 because the control voltage is the capacitance across capacitor 556 while switch 552 is closed. Similarly, once timeslot 202 ends and window 206 initiates, switch 552 opens while switch 554 closes. Thus, capacitor 560 will charge based on the second reference voltage. Hence, capacitor 560 acts to control the VCO 412 and ultimately FOUT during timeslot 204 because the control voltage is the capacitance across capacitor 560 while switch 554 is closed. In other words, for each timeslot 202, switch 552 is closed while switch 554 is open. Similarly, for each timeslot 204, switch 554 is closed while switch 552 is open. This enables capacitor 556 to ultimately control FOUT (i.e., the carrier frequency) due to capacitor 556's control of the control voltage during timeslot 202 while capacitor 560 ultimately controls FOUT (i.e., the carrier frequency) due to capacitor 560's control of the control voltage during timeslot 204. Because the filter characteristics of loop filter 410, except for the control voltage, should be the same during each of timeslots 202 and 204, the capacitance of capacitors 556 and 560, in some embodiments, are equal.

After the initial timeslots 202 and 204, capacitors 556 and 560 are fully charged. Therefore, in all subsequent timeslots 202 and 204, once switch 552 closes for timeslot 202 and switch 554 closes for timeslot 204, the time to bring the control voltage to the required voltage to generate the carrier frequency is reduced substantially. In some embodiments, the time to bring the control voltage to the required voltage to generate the carrier frequency is less than 1.5 ms. In this way, loop filter 410 acts to allow for fast re-lock between alternating output frequencies of PLL 422.

Figure 6:
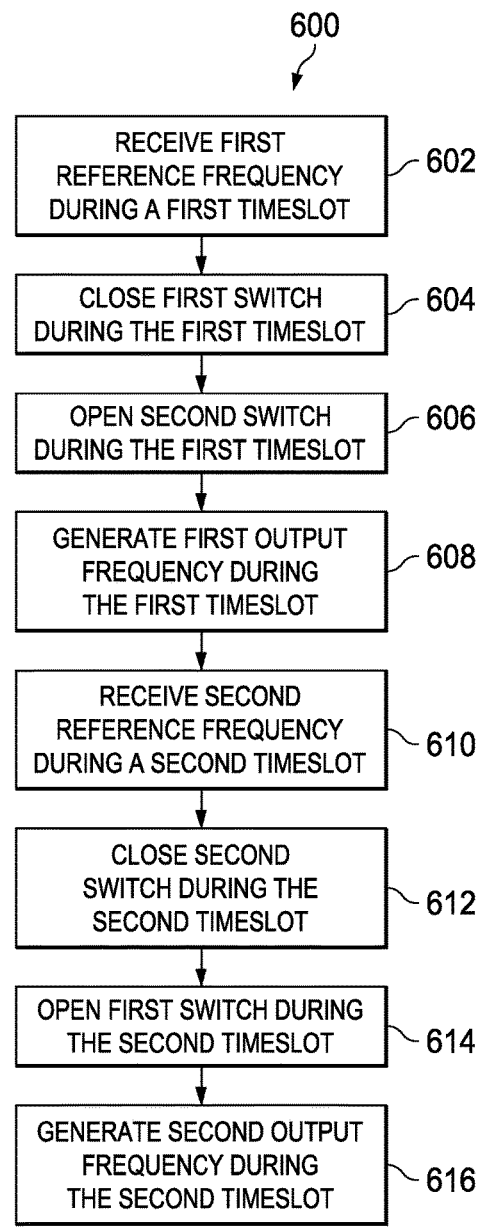
FIG. 6 shows a flow diagram for a method of locking two output frequencies to two reference frequencies in a low bandwidth PLL in accordance with various embodiments.

FIG. 6 shows a flow diagram for a method 600 of locking two output frequencies to two reference frequencies in low bandwidth PLL 422 in accordance with various embodiments. Though depicted sequentially as a matter of convenience, at least some of the actions shown in method 600 can be performed in a different order and/or performed in parallel. Additionally, some embodiments may perform only some of the actions shown or may perform additional actions. In some embodiments, at least some of the operations of the method 600, as well as other operations described herein, can be performed by frequency synthesizer 302 implemented by a processor executing instructions stored in a non-transitory computer readable storage medium or a state machine.

The method 600 begins in block 602 with receiving a first reference signal during a first timeslot (e.g., timeslot 202). The first reference signal may be received by PLL 422. In block 604, the method 600 continues with closing a first switch, such as switch 502 from FIG. 5A or switch 552 from FIG. 5B during the first timeslot (e.g., timeslot 202). The first switch may be included in loop filter 410 in PLL 422 and may be connected in series to a first capacitor, such as capacitor 506 or 556. Furthermore, the first switch may be connected in parallel with a second switch, such as switch 504 or 554 and a second capacitor, such as capacitor 508 or 560. In block 606, the method 600 continues with opening the second switch, such as switch 504 or 554 during the first timeslot (e.g., timeslot 202). The method 600 continues in block 608 with generating a first output frequency by the PLL 422 based on the first reference frequency during the first timeslot (e.g., timeslot 202).

In block 610, the method 600 continues with receiving a second reference signal during a second timeslot (e.g., timeslot 204). The second reference signal may be received by PLL 422. In block 612, the method 600 continues with closing the second switch, such as switch 504 from FIG. 5A or switch 560 from FIG. 5B during the second timeslot (e.g., timeslot 204). The second switch may be included in loop filter 410 in PLL 422 and may be connected in series to the second capacitor, such as capacitor 558 or 562. Furthermore, the second switch may be connected in parallel with the first switch, such as switch 502 or 552 and the first capacitor, such as capacitor 506 or 556. In block 614, the method 600 continues with opening the first switch, such as switch 502 or 552 during the second timeslot (e.g., timeslot 204). The method 600 continues in block 616 with generating a second output frequency by the PLL 422 based on the second reference frequency during the second timeslot (e.g., timeslot 204).

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A frequency synthesizer, comprising:
a reference frequency scaler configured to generate a first reference frequency and a second reference frequency; and
a phase locked loop (PLL) coupled to the reference frequency scaler, the PLL configured to generate a first output frequency based on the first reference frequency during a first timeslot and a second output frequency based on the second reference frequency during a second timeslot that alternates with the first timeslot;
wherein the PLL comprises a loop filter that includes: a first switch coupled in series to a first capacitor and configured to close during the first timeslot and to open during the second timeslot, without discharging a total charge of the first capacitor during the second timeslot; a second switch coupled in series to a second capacitor and configured to open during the first timeslot and to close during the second timeslot, without discharging a total charge of the second capacitor during the first timeslot and a third capacitor coupled in parallel to the first capacitor;
wherein: the first and second switches are coupled in parallel to one another; and the first and second capacitors are coupled in parallel to one another through the first and second switches respectively.

2. The frequency synthesizer of claim 1, wherein the third capacitor has a capacitance between 15 to 35 times less than respective capacitances of the first and second capacitors.

3. The frequency synthesizer of claim 1, wherein the first and second capacitors have a capacitance equal to one another.

4. The frequency synthesizer of claim 1, wherein the first output frequency is in a same frequency band as the second output frequency.

5. The frequency synthesizer of claim 1, wherein the first output frequency is between 50 and 70 MHz greater than the second output frequency.

6. A digital radio, comprising:
a radio frequency transceiver configured to transmit: a first carrier frequency in a communication channel during a first timeslot; and a second carrier frequency in the communication channel during a second timeslot that alternates with the first timeslot; and
a frequency synthesizer coupled to the radio frequency transceiver, the frequency synthesizer configured to generate the first and second carrier frequencies for the radio frequency transceiver, the frequency synthesizer comprising: a first switch coupled in series to a first capacitor and configured to close during the first timeslot and to open during the second timeslot, without discharging a total charge of the first capacitor during the second timeslot; a second switch coupled in series to a second capacitor and configured to open during the first timeslot and to close during the second timeslot, without discharging a total charge of the second capacitor during the first timeslot; and a third capacitor coupled in parallel to the first capacitor;
wherein: the first and second switches are coupled in parallel to one another; and the first and second capacitors are coupled in parallel to one another through the first and second switches respectively.

7. The digital radio of claim 6, wherein the first capacitor has a capacitance equal to a capacitance of the second capacitor.

8. The digital radio of claim 6, wherein the first carrier frequency is in a same frequency band as the second carrier frequency.

9. The digital radio of claim 6, wherein the first carrier frequency is between 50 and 70 MHz greater than the second carrier frequency.

10. The digital radio of claim 6, wherein the third capacitor has a capacitance between 15 to 35 times less than respective capacitances of the first and second capacitors.

11. A method, comprising:
receiving a first reference frequency by a phase lock loop (PLL) during a first timeslot;
during the first timeslot, in the PLL: closing a first switch coupled in series to a first capacitor; opening a second switch coupled in series to a second capacitor, without discharging a total charge of the second capacitor during the first timeslot; and generating a first output frequency by the PLL based on the first reference frequency;
receiving a second reference frequency by the PLL during a second timeslot that alternates with the first timeslot; and
during the second timeslot, in the PLL: opening the first switch, without discharging a total charge of the first capacitor during the second timeslot; closing the second switch; and generating a second output frequency by the PLL based on the second reference frequency;
the first and second switches being coupled in parallel to one another; the first and second capacitors being coupled in parallel to one another through the first and second switches respectively; and a third capacitor being coupled in parallel to the first capacitor.

12. The method of claim 11, wherein the first capacitor has a capacitance equal to a capacitance of the second capacitor.

13. The method of claim 11, wherein the first output frequency is in a same frequency band as the second output frequency.

14. The method of claim 11, wherein the first output frequency is between 50 and 70 MHz greater than the second output frequency.

15. The method of claim 11, wherein the third capacitor has a capacitance between 15 to 35 times less than respective capacitances of the first and second capacitors.

* * * * *